United States Patent [19]

Pollak

[11] Patent Number: 5,084,909

[45] Date of Patent: Jan. 28, 1992

[54] METHOD OF PROCESSING GEMSTONES TO ENHANCE THEIR COLOR

[76] Inventor: Richard D. Pollak, 3133 Via De Caballo, Encinitas, Calif. 92024

[21] Appl. No.: 497,997

[22] Filed: Mar. 23, 1990

[51] Int. Cl.$^5$ .............................................. G21K 5/00
[52] U.S. Cl. ................................. 378/64; 250/492.1; 204/157.15; 204/157.44
[58] Field of Search ....................... 378/64; 250/492.1; 204/157.15, 157.44, 157.46, 157.47

[56] References Cited

U.S. PATENT DOCUMENTS

| | | | |
|---|---|---|---|
| 2,998,365 | 8/1961 | Custers | 204/157.44 |
| 3,616,357 | 10/1971 | Haynes | 204/157.44 |
| 4,749,869 | 6/1988 | Fournier | 250/492.1 |

Primary Examiner—Janice A. Howell
Assistant Examiner—David P. Porta
Attorney, Agent, or Firm—Baker, Maxham, Jester and Meador

[57] ABSTRACT

Color enhanced topaz, beryl, tourmalines, quartz, diamonds and other gem material products, both natural and synthetic, and the process by which they are color-enhanced are described. In this process rough or finished gemstones of virtually any size, in particular very large single pieces weighing approximately one hundred carats up to 10 kilograms, are placed in a very high energy gamma ray field for extended periods of time, on the order of 50 hrs to 1000 hrs, or more, to give total exposures of 400 megagards up to 8000 megagards. The gamma flux used may be in the range of 0.5 MEV up to 30 MEV or more. In particular, the rays will be substantially higher energy than those available from conventional cobalt 60 or cesium 137 and similar sources.

15 Claims, 1 Drawing Sheet

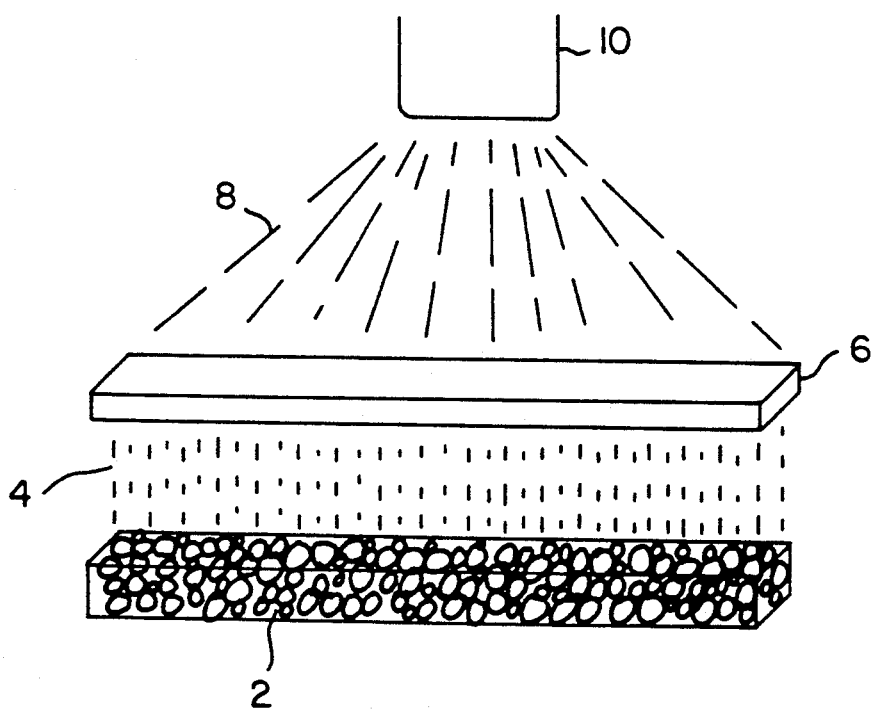

METHOD OF PROCESSING GEMSTONES TO ENHANCE THEIR COLOR

BACKGROUND OF THE INVENTION

The present invention relates to processing gemstones to enhance their color, and in particular, to color enhancement through gamma ray bombardment.

In the early 1970's, Joe Borden and Charles Key produced and marketed sky blue topaz stones which had been subjected to electron bombardment. The color of these stones varied from light blue through extremely intense shades which could not be distinguished in appearance from California Blue. They also produced and marketed a small number of topaz gemstones with extremely dark colors, even to the point of showing some greenish and greyish overtones. The color of the gemstones depended upon the source of rough topaz and the dose of radiation. Each stone was found to have a color saturation point beyond which further irradiation would not enhance the color or would not be cost effective in further enhancing the color. The size of such sky blue topaz stones that could be produced was severely limited by the ability of 8-17MEV electrons to penetrate more than approximately three-quarters of an inch of topaz, the ability of the topaz to dissipate heat at the rate of energy applied, and the size of container used to allow forced circulation of water for cooling the stones during irradiation.

Also in the early 1970's, Romanelle & Associates perfected the neutron irradiation of topaz gemstones in Britain to create "London Blue". These gemstones had a very dark color, which sometimes had a grey or green cast, making such gemstones less marketable. Messrs. Borden and Key experimented with some of this inferior London Blue product by bombarding it with electrons, and thus became the first to produce "California Blue" (aka Super Blue, Electra Blue, American Blue). The cost of buying London Blue gemstones from Romanelle was high and the cost of Brazilian rough which would produce intense sky blue colors was still low, so they made limited use of their invention.

During the 1970's and early 1980's a great deal of misleading and incorrect information relating to gemstone irradiation was published in the trade journals. Dr. George Rossman at Caltech, the GIA, and others elsewhere began research in the field in the mid 1970's, but no one was able to actually explain the source of blue colors which formed in topaz.

By 1984 or early 1985, a product similar to, but not necessarily the same as, California Blue was being produced by Zimmerman in Germany and marketed in the USA. Several different qualities of blue color abounded in the trade, all with the appellation "Swiss Blue". Stones from some sources had the appearance of California Blue, but from other sources they merely looked strong in blue with some greyishness.

During the 1984-1985 time frame, I received some dark greyish London Blue stones from a customer of my ongoing gemstone color enhancement service (United Radiant Applications) and was asked to improve the color, which I did by repeating the former experiment of Messrs. Borden & Key, using electron irradiation to produce "California Blue" topaz. Prior to this I had established the use of heat, both to lighten London Blue that was over-irradiated and to eliminate some of the greenish or greyishness in bad batches and had offered heat treatment of London Blue Topaz as a service to my customers. Thus, heating either before or after the application of electron bombardment was naturally used to help the process along. I found that some types of London Blue topaz were very stubborn, having to be heated very much hotter and longer than other types to lighten color or remove undesirable tints. Some required only one hour (approx. 800 MR) of electron bombardment, but others ten hours. (approx. 8000 MR).

I immediately recognized the commercial importance of Borden and Key's experiment, because, unlike theirs, my principal occupation was treating gems for customers. Market conditions had changed so that poorly colored London Blue was inexpensive and heavily discounted relative to the better product. So I began at once to offer to produce "Super Blue", as it was then called, from poorly colored London Blue.

However, approximately two weeks later, Richard Fournier did the same experiment at the irradiation lab I also used. As he had begun in the early 80's to produce large amounts of London Blue, he was able to take much greater immediate commercial advantage of the process with his own material.

The lab that Fournier and I used had recently opened a new linear accelerator facility, and the arrangements for irradiating topaz were changed from those formerly used.

SUMMARY OF THE INVENTION

The present invention adds and/or improves the color of topaz, tourmaline, diamonds, quartz, beryl and other minerals, by a process different than those heretofore used. The purpose of the process is to enhance the value of gemstones by increasing or decreasing their color intensity to that which is considered more "rare" or marketable and which cannot be done in any other way because of the size of the stones, fragility due to flaws or prior treatment, their thickness, shape, geometry, or the excessive residual radiation which could be induced by other methods. The process may be used to produce "normal" sky blue and the very desirable intensified "California Blue" (aka "Super Blue", "Electra Blue", "American Blue").

The present invention provides a method of processing gemstones for color enhancement by use of gamma rays in combination with heat, chemical treatment, other forms of radiation by subatomic particles, ion bombardment either prior to or subsequent to the application of the gamma flux. I have invented: a) a new and better method of producing California Blue from neutron irradiated topaz; b) a new and better method or finished condition, without the grey cast normally associated with Co60 irradiated stones, and of deeper color than the Co60 is capable of producing; c) a new and better method of color enhancing very large rough crystals, carvings or other finished forms of tourmaline quartz and beryl and other gems such that the colors obtained are more uniform throughout pieces of great thickness; d) a new and different method of color-enhancing any size rough or finished gems such as tourmaline and quartz which can produce a better color or a change in color and/or other physical properties, which is not accomplished by ordinary Co60 gamma rays, and which in and of itself or in combination with subsequent treatments renders the gemstone more valuable; e) a new and better method of producing California Blue and/or London Blue Topaz by irradiation with neutrons, protons and/or other subatomic particles and/or high energy gamma rays without the use of a nuclear reactor.

It is an object of the present invention to produce a greater yield of exceptionally colorful stones, especially California blue topaz, by virtue of their size than materials irradiated with electrons only.

Another object of the present invention to provide a fundamentally different method of processing London Blue topaz into California Blue which overcomes the limitations of size, placement in the radiation field, and which improves the recovery of unbroken stones. Thus, the present invention is superior in respect of economy as well as efficacy.

It is a further object of the invention to provide an alternative and superior method of eliminating the steely-grey and/or green color from London Blue topaz and avoiding breakage during irradiation.

A still further object of the present invention is to provide a method of producing sky blue and/or California Blue and/or London Blue topaz by irradiation with neutrons of energy much higher than those available in typical reactors or with protons of sufficient energy (and hence, range) to penetrate the particular the particular size gems. A benefit of using such high energy (3-300MEV) particles is the avoidance of extraneous activations by thermal or even the somewhat higher energy neutrons present in reactor irradiations. Even though the topaz may be colorless or light colored after such irradiation it can then be irradiated with gamma rays, to London Blue, or with electrons or higher energy gamma to produce sky blue or California Blue. An intermediate heating step may be used to anneal the topaz to improve its physical stability.

BRIEF DESCRIPTION OF THE DRAWING

The drawing illustrates the irradiation of topaz 2 with gamma rays 4 obtained by bombarding a Tungsten plate 6 with electrons 8 from a linear accelerator 10.

DESCRIPTION OF THE PREFERRED EMBODIMENTS

The entire disclosure of U.S. Pat. No. 4,749,869 entitled "PROCESS FOR IRRADIATING TOPAZ AND THE PRODUCT RESULTING THEREFROM" granted June 7, 1988 to Richard Fournier is specifically incorporated herein by reference.

The reason for the blue color in both electron and neutron irradiated topaz has not been widely known. It has been attributed merely to displacement of electrons (as in the discussion in U.S. Pat. No. 4,749,869) or to the displacements of atoms within the crystal lattice to form F center and/or other color centers. Furthermore, the steely-grey tones in London Blue have been attributed to neutrons as well as gamma rays.

It appears that the actual cause of blue color in topaz may be the presence of phosphorous as an impurity which allows the formulation of color centers by irradiation strong enough to displace the electrons. London Blue may be caused first by the transformation of silicon into phosphorous by neutron bombardment. Only after the phosphorous is present in the crystal structure can the associated gamma rays caused by the reaction of the neutrons with the shielding materials in the reactor produce the blue and grey color centers. Since the blue and grey are persistent upon heating to a much higher temperature in reactor irradiated topaz than in that irradiated by gamma or electron, it may be that the neutrons also cause atomic displacements which assist in the formation and stabilization on the color centers. A difference is also indicated by the different $(A+B)$ axes on which the color of London Blue forms.

Natural topaz containing phosphorous from 10-150 ppm will turn light-deep blue upon irradiation by gamma rays or electrons, with color forming on the C-axis of the crystal. Thus, if sufficient phosphorus were to be added to topaz either by formation in situ by nuclear reaction; by ion bombardment, or by diffusion, blue color could be subsequently generated by gamma or electron bombardment. Such color centers could be stabilized to heat by bombardment with high energy neutrons to cause atomic displacements. Furthermore, the crystal can be "healed", restored, to be more like its former structure by electron or high energy gamma irradiation subsequent to bombardments causing atomic displacements.

The in situ formation of phosphorous can be achieved by transformation of silicon into phosphorous through bombardment with either protons or neutrons or other sub-atomic particles. This California Blue can be produced without resort to the London Blue process or nuclear reactors, or even electron bombardment.

My invention, makes use of the energy heretofore wasted to perform various gem treatments; especially to "pre-screen" or "pre-treat" the topaz with a low dose of radiation in order to select, by subsequent visual inspection, which individual pieces are profitable to treat sky blue with electron irradiation. My invention provides a general substitute for Co60 gamma irradiation. My new method is superior to Co60 for prescreening as some stones are not affected by Co60 gamma radiation.

In accordance with my method, gemstones are placed in an intense gamma ray field of 0.5 to 30MEV photons, and more preferably 3 to 25 MEV, either in air, or in water, or other cooling medium. Quartz is then irradiated until a dose of 17 to 400 megarads is accumulated; Tourmaline for 20 to 400 megarads; Beryl for 400 to 8,000 megarads; Diamonds for 400 to 10,000 megarads; and Topaz for 200-10,000 megarads. The stones may then be heat-treated and/or exposed to sunlight, or other source of UV radiation, to eliminate undesirable or extraneous shades of color and/or to lighten the color back to the most marketable tone. In particular, quartz is heated to 160-400 degrees centigrade to eliminate or lighten the dark smoky color generated by irradiation and to leave a pleasing smokiness, amethyst or citrine yellow color. Tourmaline is heat treated to 200-900 degrees centigrade to reduce orange/brown color which may develop in addition to the desirable pink/red added by irradiation. Beryl is heated to 175-400 degrees centigrade to eliminate green/brown shades from the good yellow/golden colors produced by irradiation. Diamonds are heated to 500-1100 degrees centigrade to lighten green, or eliminate green to leave yellow, or to change green to red/brown color in irradiated diamonds.

In the case of blue topaz produced from colorless or light blue colored stones by irradiation with a 200 to 10,000 megarad dose of 3-25MEV gamma rays, heating is performed in the standard way, after irradiation at 175-250 degrees centigrade to eliminate the brown color and leave the refined "sky blue" color. The most exceptionally intense sky blue is known as "California Blue." Since this color is not obtainable by Co60 or similar irradiation, and since electron irradiation is generally limited to stones of no more than three-quarters of an inch thickness, the present invention is able to produce a much higher yield of topaz which could be classified as the very desirable and marketable "California Blue."

For the purposes of improving the color of London Blue topaz, the optimum heating temperature is in the range of 500-600 degrees centigrade for a very short period of time, i.e. just a few minutes. Higher temperatures, up to 700 degrees centigrade, begin to degrade the color, rather than improve it, at least, on the specimens I tested. Using lower temperatures requires considerably longer heating times, e.g. 420 degrees centigrade take over 4-6 hours. Lower temperatures take even longer, but the results are not as good as the higher temperatures no matter how long the heating. These comments pertain to heating both before or after gamma irradiation.

In some cases, no heating at all is required for the proper enhancement and evening out of the color in poorly colored London Blue topaz, the gamma irradiation by itself being sufficient.

Unlike the "Super Blue" process, based on electron radiation, the relative low to high energies ($\frac{1}{2}$ to 30 MEV) of gamma radiation causes the color to intensify by eliminating the green and grey colors throughout the stone. Because my method uses gamma rays, and not electrons, the problem of electron discharge, which can damage the stone, is eliminated. Therefore, my method allows a larger quantity of gemstones to be processed at one time.

The higher the MEVs of the gamma radiation, the better the effect it has on the stones to eliminate the greens and greys of the neutron treated stones. I have found that the best way for achieving higher energy gammas is to use a linear accelerator, cyletron, or any high energy particle accelerator, and by converting electrons to gamma rays by using any conventional or non-conventional target, like platinum or tungsten. For low energy gamma rays it is possible to use isotopes, like Co60, Cs137, etc. or low energy particle accelerators. One suitable commercially available linear accelerator is the BC-20 manufactured by Brobeck Corporation of 1235 - Tenth St., Berkeley, California 94710. It is designed to operate at an energy of 10 MEV and provide electron beam power to 20KW.

In the case of blue topaz which has been irradiated with neutrons in a nuclear reactor to make "London Blue" topaz, my invention allows for heating the stones at 300 up to 600 degrees centigrade, prior to irradiation with 3-25MEV gamma rays to an approximate dose of 1,000-10,000 megarads, in order to produce California Blue topaz of virtually any size. My invention is not limited to gemstones of approximately three-quarters of an inch in thickness or less as is the similar electron process.

The production of California Blue topaz by electron irradiation often results in partial or total breakage of London Blue topaz by electrical discharge. This frequently occurs even in stones much smaller than the three-quarter of an inch limitation on thickness limit. The cause of the breakage is not apparent from visual examination. The breakage problem can be somewhat ameliorated by proper placement of the stones during electron irradiation. However, this severely limits the amount that can be processed at once and does not completely eliminate the breakage.

The steely-grey and or green color of London Blue topaz can be eliminated, and breakage during irradiation can be avoided, by annealing the London Blue topaz at 300-600 centigrade prior to the electron irradiation, rather than afterwards. Heating after electron irradiation does not help the survival of the stones during such irradiation. Yet the prior heating works as well or better to reduce the steely-grey and/or green color which impairs the marketability of some reactor neutron irradiated London Blue.

With my invention, approximately 400 megarads may be obtained in 50 hours, and up to 10kg or more of material may be exposed at once, which is five times the weight processed by the electron bombardment at the rate of approximately 800 megarads/hr. So, the useful waste radiation amounts to approximately 5% of the total.

Not only does my method more correctly imitate the linear accelerator action for prescreening purposes on topaz, but it may also be used to treat topaz and other gem minerals in ways not possible by any of the methods formerly employed. A single topaz crystal in excess of 1 kg which had been subjected to approximately 1500 megarads of Cs137 gamma rays did not indicate very good color potential. But after just one 50 hr, approximately 400 megarad dose of the 8-12MEV gamma rays, the color became very deep sky blue in the thick cross section, much superior to the color from electron bombardment. Just as important, it did not break from electrical discharge as any rough stone even a fraction that size would be sure to do under electron bombardment.

Various color changes have been observed in amethyst, colorless or pale quartz and certain tourmalines which did not respond to Co60 gamma rays, and which were too fragile or too costly to irradiate in the electron linac. As normally practiced short doses of electron irradiation became expensive due to set up time and cooling off time before the personnel can enter the chamber. Nigerian topaz exposed to 8000 megarads of Co60 gamma rays failed to achieve worthwhile color. The 1 and 1.3 MEV gamma rays from Co60 is simply unable to activate the color change. Whereas, only 400 megarads of the more energetic 8-12MEV gamma rays will give a stronger, better quality blue than 20 times the dose of lower energy rays in the Nigerian and lower qualities of Brazilian topaz abundantly available.

In a preferred embodiment of my invention, London Blue Topaz which has been neutron irradiated and is very greyish or otherwise poorly colored, is subjected to gamma rays. By subsequent, prolonged careful heating of the topaz, a bright, deep blue color is obtained. Sometimes it is beneficial to heat the topaz before, as well as after, the gamma irradiation. Gamma ray sources of between about 0.5 MEV and 30MEV will suffice. The heating is conducted between about 250 and 700 degrees centigrade for periods between about 15 minutes and several days, e.g. seventy-two hours. The lower temperatures requiring longer heating times, as well as the more "stubborn" topaz stones.

Heretofore, gamma rays generated by linear accelerators, betatrons, and other devices were considered too expensive for gemstone treatments. This is because the primary linear accelerator generates electrons and the efficiency of the conversion to gamma is only about 10%. My invention utilizes a strong, useable (concentrated) gamma flux that is a byproduct of the ordinary electron topaz irradiation process. The high energy gamma radiaton which was formerly ten times as costly as electrons is thus essentially free and available. This valuable radiation source could be marketed for uses other than gem enhancement. It could also be used to generate a neutron flux when appropriate elements are present in the material being irradiated.

While I have described preferred embodiments of my invention, it may be varied in detail. Therefore the protection afforded my invention should only be limited in accordance with the scope of the following claims.

I claim:

1. A method of processing a gemstone to enhance its color comprising:
   heating the gemstone to a temperature of between about 150 and 1,100 degrees Centigrade for a period of between about fifteen minutes and fifty hours; and then
   irradiating the gemstone with gamma rays to give a total exposure of between about 200 and 10,000 megarads.

2. A method according to claim 1 wherein the gemstone is topaz previously irradiated with neutrons, and the topaz is heated to a temperature of between about 300 and 600 degrees centigrade prior to irradiation with about 3 to 25 MEV gamma rays.

3. A method according to claim 1 and further comprising the step of heating the gemstone after gamma ray irradiation thereof to a temperature between about 160 and 1,100 degrees centigrade for a period of between about fifteen minutes and fifty hours.

4. A method according to claim 1 wherein the gamma rays have a flux between about 0.5 MEV and 30 MEV.

5. A method according to claim 1 and further comprising the step of irradiating the gemstone with neutrons prior to gamma ray irradiation.

6. A method according to claim 5 and further comprising the step of irradiating the gemstone with electrons after the neutron irradiation and prior to the gamma ray irradiation.

7. A method according to claim 5 wherein the neutron irradiation is between about 1,000 and 10,000 megarads.

8. A method according to claim 6 wherein the electrons are provided in the form of a beam having a flux of between about 8 and 17 MEV.

9. A method according to claim 1 wherein the gemstone is selected from the group consisting of topaz, beryl, tourmaline, quartz and diamond.

10. A method of processing a topaz stone to enhance its color comprising:
    irradiating the topaz stone with neutrons;
    heating the topaz stone to a temperature of between about 300 and 600 degrees Centigrade; and
    irradiating the gemstone with about 3 to 25 MEV gamma rays to give a total exposure of between about 200 and 10,000 megarads.

11. A method according to claim 10 wherein the heating takes place for a period of between about fifteen minutes and fifty hours.

12. A method according to claim 10 and further comprising the step of heating the topaz after gamma ray irradiation thereof to a temperature between about 160 and 1,100 degrees Centigrade for a period of between about fifteen minutes and fifty hours.

13. A method according to claim 10 and further comprising the step of irradiating the topaz stone with electrons after the neutron irradiation and prior to the gamma ray irradiation.

14. A method according to claim 13 wherein the electrons are provided in the form of a beam having a flux of between about 8 and 17 MEV.

15. A method according to claim 10 wherein the neutron irradiation is between about 1,000 and 10,000 megarads.

* * * * *